United States Patent [19]

Ishii et al.

[11] Patent Number: 5,637,961

[45] Date of Patent: Jun. 10, 1997

[54] CONCENTRIC RINGS WITH DIFFERENT RF ENERGIES APPLIED THERETO

[75] Inventors: Nobuo Ishii, Yamanashi-ken; Kibatsu Shinohara, Yokohama, both of Japan

[73] Assignee: Tokyo Electron Limited, Tokyo, Japan

[21] Appl. No.: 517,105

[22] Filed: Aug. 21, 1995

[30] Foreign Application Priority Data

Aug. 23, 1994 [JP] Japan .................................. 6-198369
Feb. 28, 1995 [JP] Japan .................................. 7-039822

[51] Int. Cl.⁶ .................................................. H01J 7/24
[52] U.S. Cl. .................. 315/111.51; 315/111.21
[58] Field of Search ...................... 315/111.21, 111.51

[56] References Cited

U.S. PATENT DOCUMENTS

| | | | |
|---|---|---|---|
| 4,795,880 | 1/1989 | Hayes et al. | 315/111.51 |
| 5,194,731 | 3/1993 | Turner | 315/111.51 |
| 5,285,046 | 2/1994 | Hansz | 315/111.51 |
| 5,401,350 | 3/1995 | Patrick et al. | 156/345 |

*Primary Examiner*—Robert Pascal
*Assistant Examiner*—Michael Shingleton
*Attorney, Agent, or Firm*—Oblon, Spivak, McClelland, Maier & Neustadt, P.C

[57] ABSTRACT

A plasma generating apparatus comprises a chamber for containing an object to be treated, a pair of high frequency coils located concentric in the chamber and opposed to the object, to generate alternating magnetic fields for inducing alternating electric fields in the chamber, the alternating electric fields creating plasma used to treat the object, a high frequency power supply for generating a high frequency power, distribution means for distributing the high frequency power into a plurality of distributed powers at a predetermined distribution ratio, phase shifter means for shifting the phase of each of the distributed powers, and a matching box for supplying the high frequency coils with the distributed powers of phases set by the phase shifter means, respectively.

10 Claims, 4 Drawing Sheets

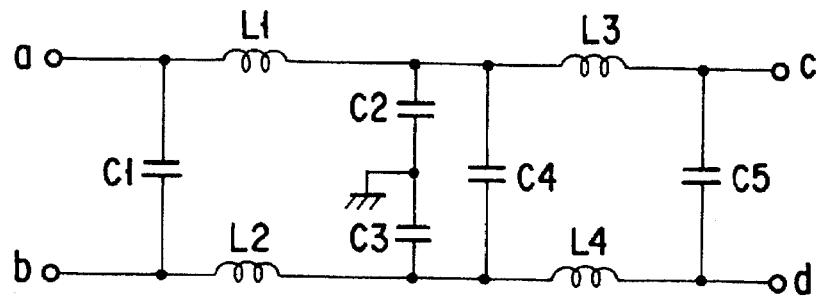
F I G. 2
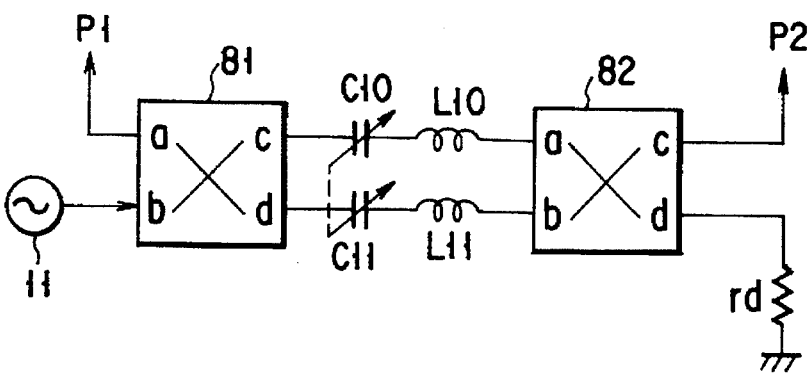
F I G. 3
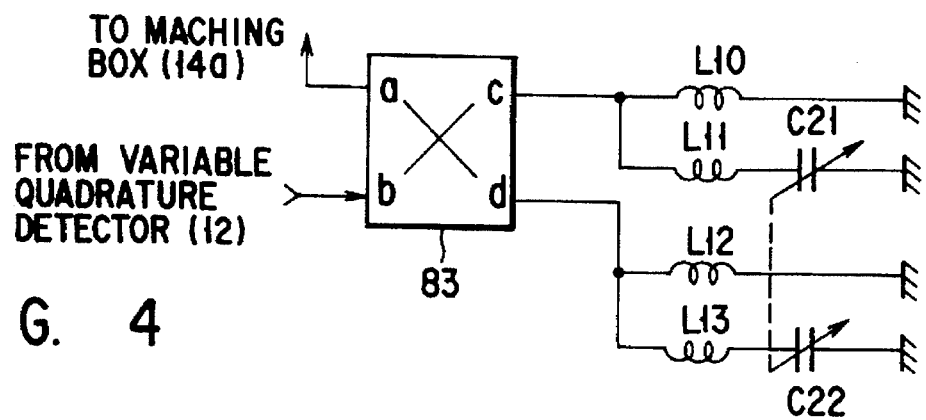
F I G. 4
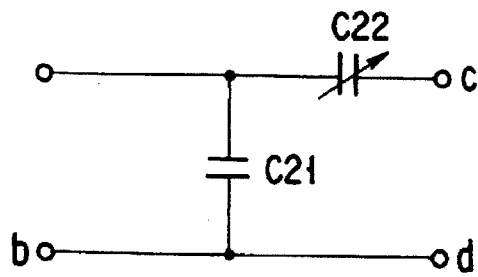
F I G. 5

CONCENTRIC RINGS WITH DIFFERENT RF ENERGIES APPLIED THERETO

BACKGROUND OF THE INVENTION

1. Field of the Invention

This invention relates to a plasma apparatus capable of changing the distribution of generated plasma.

2. Description of the Related Art

In manufacturing a semiconductor integrated circuit, for example, plasma is used to accelerate ionization or chemical reaction of treatment gases in ashing, etching, CVD (Chemical Vapor Deposition), etc. A high frequency induction system using a spiral antenna is known as a method for generating such plasma.

As is described, for example, in European Patent Application No. 379,828, in the high frequency induction system, that surface (the upper surface, in general) of a chamber which is opposed to a wafer chuck is made of an insulator such as quartz glass, and a spiral antenna is secured to an outer wall surface of the chamber. A high frequency current is flown through the chamber to form a high frequency electromagnetic field, thereby causing electrons flowing through the electromagnetic fields to collide with neutrons of a treatment gas, ionize the gas and generate plasma.

Further, to precisely and widely control the region in which plasma is generated, it has been proposed that the spiral antenna is divided into two antenna elements, and a high frequency power is applied to each antenna element.

The thus-generated plasma is used in a discharge process for discharging the electricity accumulated on the wafer chuck, in a cleaning process for cleaning the walls of the chamber, and in an etching process.

Since the discharge process, the cleaning process and the etching process require plasma of different distributions, it is necessary to create plasma of an optimal distribution in each process.

SUMMARY OF THE INVENTION

It is the object of the invention to provide a plasma apparatus capable of varying the distribution of plasma generated and providing an optimal plasma distribution in each process.

According to a first aspect of the invention, there is provided a plasma generating apparatus comprising: a chamber for containing an object to be treated the chamber being filled with a treatment gas; a plurality of high frequency coils located on at least one of the outside portion and inside portion of the chamber and at a position opposed to the object, to ionize the treatment gas for treating the object; a high frequency power supply for generating a high frequency power; a distribution section for distributing the high frequency power into a plurality of distributed powers at a predetermined distribution ratio; phase shifter means for shifting the phase of each of the distributed powers; and a power supply for supplying the high frequency coils with the distributed powers of phases set by the phase shifter, respectively.

According to a second aspect of the invention, there is provided a plasma generating apparatus comprising: a chamber for containing an object to be treated, the chamber being filled with a treatment gas; a pair of parallel electrodes located on at least one of the outside portion and inside portion of the chamber and at a position opposed to the object, to ionize the treatment gas for treating the object; a high frequency power supply for generating a high frequency power; a distribution section for distributing the high frequency power into a plurality of distributed powers at a predetermined distribution ratio; a phase shifter for shifting the phases of the distributed powers; and a power supply for supplying the parallel electrodes with the distributed powers of phases set by the phase shifter means.

The distribution of generated plasma is changed by changing the distribution ratio between distributed high frequency powers supplied to the first and second high frequency coils which are located on at least one of the outside and inside of the chamber and at a position opposed to the object, or supplied to the parallel plate electrodes located on at least one of the inside and outside of the chamber with the object interposed therebetween, and at the same time by shifting the phases of the distributed high frequency powers from each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a circuit diagram, showing a 3 dB hybrid circuit;

FIG. 3 is a circuit diagram, showing a variable quadrature detector;

FIG. 4 is a circuit diagram, showing a phase adjuster;

FIG. 5 is a circuit diagram, showing a matching box;

DETAILED DESCRIPTION OF THE PREFERRED EMBODIMENTS

The embodiments of the invention will be explained with reference to the accompanying drawings.

Figure 1:
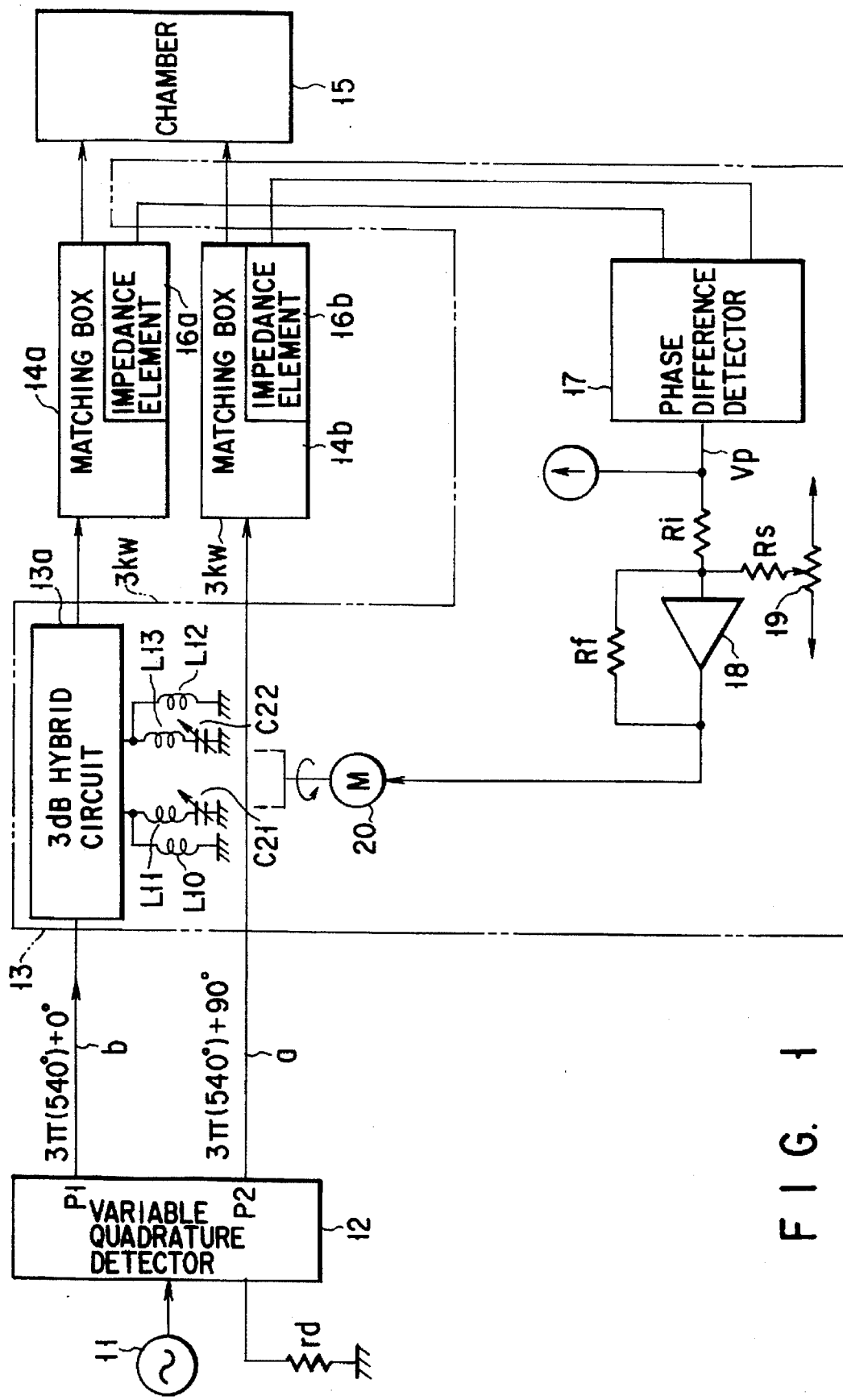
FIG. 1 is a block diagram, showing a plasma apparatus according to an embodiment of the invention.

As is shown in FIG. 1, a high frequency power supply 11 outputs a high frequency power of e.g. 13.56 MHz and 3 kW, which power is input to a variable quadrature detector 12. The structure of the variable quadrature detector 12 will be explained later in detail with reference to FIG. 3. One end of the variable quadrature detector 12 is grounded via a dummy resistor rd.

The variable quadrature detector 12 divides the high frequency voltage applied from the high frequency power supply 11, into two voltages at a distribution ratio d. Specifically, the high frequency voltage is converted to a voltage a with a phase retarded from that of the power supply 11 by $3\pi(540°)+90°$, and a voltage b with a phase retarded from that of the power supply 11 by $3\pi(540°)$, which are supplied to lines a and b, respectively.

The voltage b is input to a phase shifter 13 for shifting the phase of the voltage b. The structure of a phase adjuster 13a incorporated in the phase shifter 13 will be explained later with reference to FIG. 4. The phase shifter 13 retards the phase of the input voltage b by 0°–180°. As a result, the phase shifter 13 supplies a matching box 14a with a voltage whose phase is shifted from the input voltage of a matching box 14b by −90°–+90°. Further, the matching box 14b receives the voltage a output from the variable quadrature detector 12. The structures of the matching boxes 14a and 14b are shown in FIG. 5.

The output terminals of the matching boxes 14a and 14b are connected to first and second high frequency one-turn coils (see FIG. 7), respectively, which are located in a chamber 15. The chamber 15 will be explained later in detail with reference to FIG. 6.

Impedance elements 16a and 16b are provided in the matching boxes 14a and 14b, respectively, for detecting the phases of voltages or currents supplied to the first and second high frequency one-turn coils, respectively.

The phases detected by the impedance elements 16a and 16b are supplied to a phase difference detector 17. The phase difference detector 17 detects a phase difference θ between voltages applied to or currents flowing through the first and second high frequency one-turn coils. The phase difference detector 17 has an output value proportional to the phase difference θ. For example, the detector 17 outputs 9 V for a phase difference of 90°, −9 V for a phase difference of −90°, and 0 V for a phase difference of 0°.

The phase difference detector 17 outputs a voltage Vp proportional to the phase difference θ to an operational amplifier 18 via a resistor Ri. A resistor Rf is connected between the input and output terminals of the operational amplifier 18. The input terminal of the operational amplifier 18 is connected to a phase difference setting section 19 via a resistor Rs.

The phase difference setting section 19 supplies the input terminal of the operational amplifier 18 with a voltage for setting a phase difference of currents supplied to the first and second high frequency one-turn coils.

The output of the operational amplifier 18 is supplied to a motor 20, which controls the angle of a variable capacitor incorporated in the phase adjuster 13a in accordance with the phase difference.

The structure of the plasma apparatus will be explained in more detail with reference to FIGS. 6 and 7.

Figures 6, 7:
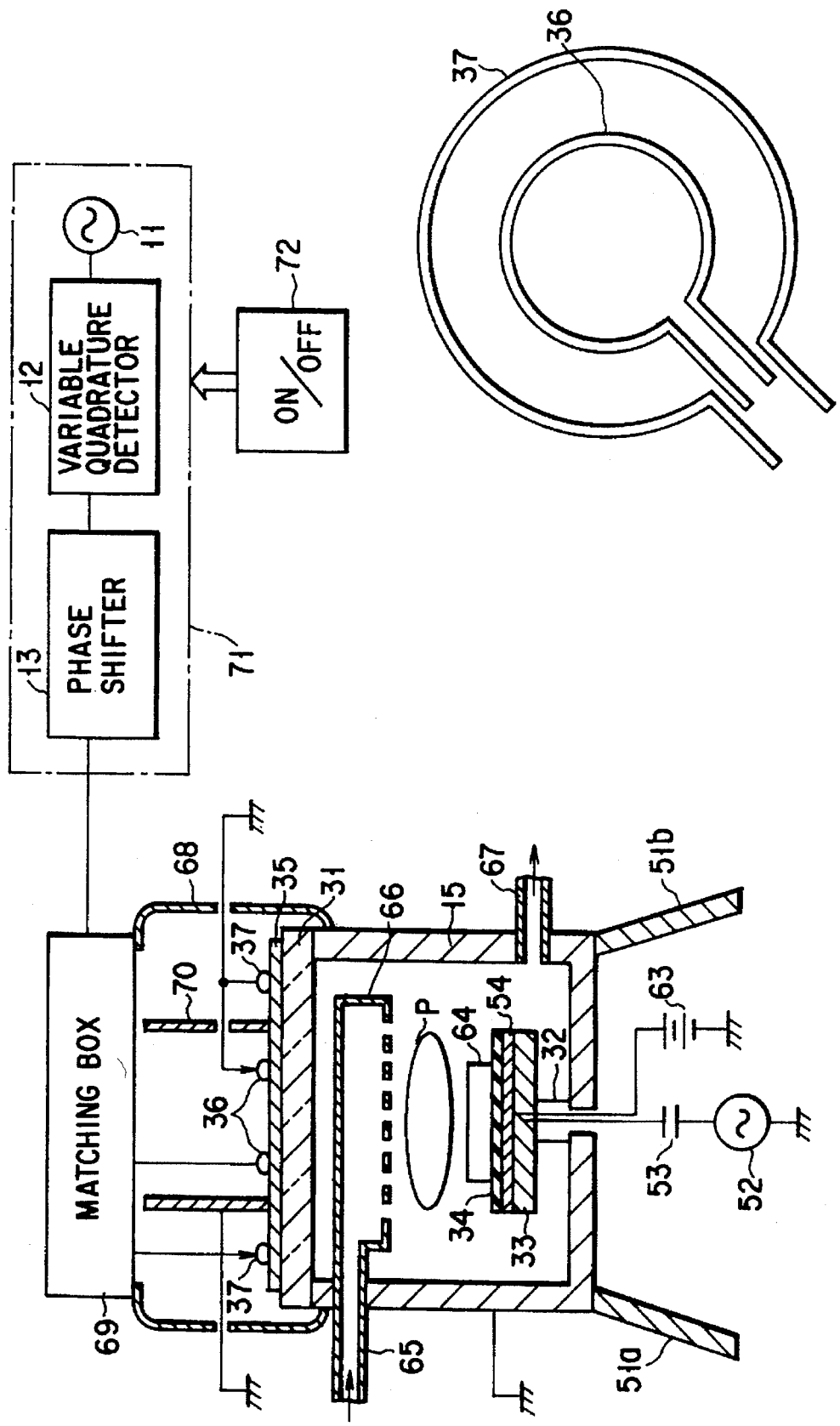
FIG. 6 is a view, showing the overall plasma apparatus.
FIG. 7 is a plan view, showing the configuration of a high frequency coil.

As is shown in FIG. 6, the chamber 15 of the plasma apparatus is formed of a cylindrical enclosed chamber which has its bottom surface and peripheral surface made of aluminum, and its upper surface 31 made of quartz glass. A cylindrical support member 32 constituted by an insulator of ceramic or quartz, etc. is provided at a central portion of the bottom surface of the chamber 15.

A disk-shaped electrode substrate 33 made of e.g. aluminum is provided on the upper surface of the support member 32, and a wafer chuck 34 constituted by an insulator such as quartz or ceramic is provided on the upper surface of the substrate 33.

A disk-shaped paramagnetic metal member 35 made, for example, of aluminum is provided for electrostatic shielding on the outer surface of the upper quartz glass surface 31 of the chamber 15. A first high frequency one-turn coil 36 and a second high frequency one-turn coil 37 are located on the paramagnetic metal member 35 with an insulator interposed therebetween. The metal member 35 is grounded.

The paramagnetic metal member 35 is provided for avoiding capacitive coupling, which may occur between the first and second high frequency coils 36 and 37 and plasma, by means of voltages applied to the coils.

FIG. 7 is a plan view of the first and second high frequency coils 36 and 37. As is shown in FIG. 7, the coils 36 and 37 are formed concentric such that the first coil 36 is located inside the second coil 37.

Legs 51a–51d (only two, i.e. 51a and 51b, of which are shown in FIG. 6) are provided on the four corners of the bottom of the chamber 15. Further, the non-grounded terminal of a lower power supply 52 is connected to the electrode substrate 33 via a capacitor 53. An electrostatic chuck electrode 54 is interposed between the electrode substrate 33 and the wafer chuck 34. The electrode 54 is kept at a positive potential by means of a DC power supply 63. A wafer 64 is placed on the wafer chuck 34.

A gas introduction pipe 65 is passed through an upper peripheral portion of the chamber 15 in an airtight manner, and connected to a shower head 66. A gas exhaustion pipe 67 is passed through a lower peripheral portion of the chamber 15. A lower end portion of a cylindrical casing 68 is secured to an upper peripheral portion of the chamber 15. A matching box unit 69 constituted by a capacitor circuit is provided for impedance matching on an upper end of the casing 68. The matching box unit 69 consists of the aforementioned matching boxes 14a and 14b. A high frequency power of 13.56 MHz is applied to the high frequency coils 36 and 37 via the matching box unit 69.

A cylindrical electromagnetic shield member 70 made of aluminum or copper is located between the first high frequency one-turn coil 36 and the second high frequency one-turn coil 37. The electromagnetic shield member 70 is provided for reducing the interference between the magnetic fields generated at the first and second high frequency coils 36 and 37. The shield member 70 is grounded.

A controller 71 indicated by the one-dot chain line in FIG. 6 comprises the high frequency power supply 11, the variable quadrature detector 12 and the phase shifter 13. An ON/OFF switch 72 controls the on/off operation of the controller 71.

Referring then to FIG. 2, a 3 dB hybrid circuit will be explained. In the hybrid circuit, a capacitor C1 is interposed between terminals a and b, and a coil L1, capacitors C2 and C3 and a coil L2 are connected parallel to the capacitor C1. The node between the capacitors C2 and C3 is grounded. A capacitor C4 is connected parallel to the capacitors C2 and C3 connected in series. Further, the capacitor C4 is connected parallel to coils L3 and L4 and a capacitor C5 which are connected in series. Terminals c and d are connected to the both opposite ends of the capacitor C5.

Referring then to FIG. 3, the variable quadrature detector 12 shown in FIG. 1 will be explained in more detail. In FIG. 3, a hybrid circuit 81 is a 3 dB hybrid circuit having the same structure as the FIG. 2 circuit. The hybrid circuit 81 has a terminal b connected to the above-described high frequency power supply 11, and a terminal a for outputting a first distributed power P1. The hybrid circuit 81 further has a terminal c connected to a terminal a of a 3 dB hybrid circuit 82 via a variable capacitor C10 and an inductance L10, and a terminal d connected to a terminal b of the hybrid circuit 82 via a variable capacitor C11 and an inductance L11. The variable capacitors C10 and C11 are rotated by a setting actuator (not shown) in synchronism with each other. Since the hybrid circuit 82 has the same structure as the FIG. 2 circuit, detailed explanation is abbreviated.

The hybrid circuit 82 further has a terminal c for outputting a second distributed power P2, and a terminal d connected to a dummy resistor rd. The variable quadrature detector 12 will be explained. First, when the setting actuator (not shown) has been rotated, thereby short-circuiting the variable capacitor C10 and the inductance L10, and also the variable capacitor C11 and the inductance L11, the power of the 3 kW high frequency power supply 11 is all output as the distributed power P2 from the hybrid circuit 82. In this case, the distributed power P1 is zero.

On the other hand, when the setting actuator has been further rotated, thereby causing the variable capacitor C10 and the inductance L10 and the variable capacitor C11 and the inductance L11 to approach their open states (in which the impedance of the capacitor C10 and the inductance L10 and that of the capacitor C11 and the inductance L11 are kept high), almost all the power of the 3 kW high frequency power supply 11 is output as the distributed power P1 from the hybrid circuit 81. In this case, the distributed power P2 is extremely low.

Further, when the setting actuator has been further rotated to shift the variable capacitor C10 and the inductance L10, and the variable capacitor C11 and the inductance L11 from their open states to their short-circuiting states, the power of the 3 kW high frequency power supply 11 is shifted from the state in which it is almost all output as the distributed power P1 from the hybrid circuit 81, through a state in which the ratio of the power output as the distributed power P2 to that output as the distributed power P1 is gradually increased, to the state in which the power is all output as the distributed power P2 from the hybrid circuit 82.

Referring then to FIG. 4, the phase adjuster 13a will be explained.

As is shown in FIG. 4, the phase adjuster 13a has a hybrid circuit 83. The circuit 83 has an input terminal b for receiving a voltage b from the variable quadrature detector 12, and an output terminal a connected to the matching box 14a. The circuit 83 further has a terminal c grounded via a coil L10 and also via a coil L11 and a variable capacitor C21, and a terminal d grounded via a coil L12 and also via a coil L13 and a variable capacitor C22. The variable capacitors C21 and C22 are rotated in synchronism with the rotation of the motor 20.

By virtue of the above structure, a voltage with a phase of $3\pi$ (540°), which is input to the terminal b in accordance with the rotation of the variable capacitors C21 and C22 synchronous with the rotation of the motor 20, can have its phase retarded by 0°–180°. Thus, the voltage with the phase of $3\pi$ (540°) input to the hybrid circuit 83 via the terminal b is output to the matching box 14a with its phase retarded by 0°–180° by means of the phase shifter 13. Since the phase of an input to the matching box 14b is $3\pi+90°$, the input of the matching box 14a can have its phase shifted by +90°—90°.

Referring to FIG. 5, the circuit structures of the matching boxes 14a and 14b will be explained. Each of the matching boxes 14a and 14b is constructed such that a capacitor C22 is connected between terminals a and b, and has one end connected to a terminal c via a variable capacitor C22 and the other end connected to a terminal d.

The operation of the thus-constructed embodiment of the invention will now be explained.

A semiconductor wafer 64 to be treated is placed on a wafer table 34. The gas contained in the chamber 15 is exhausted through a gas exhaust pipe 67, and the pressure in the chamber is set to a predetermined vacuum value, thereby allowing a predetermined treatment gas to flow into chamber 15 at a predetermined pressure and a predetermined flow rate through the gas supply pipe 65.

Thereafter, the ON/OFF switch 72 is turned on, and the power of the high frequency power supply 11 of 13.56 MHz and 3 kW is supplied to the variable quadrature detector 12. The variable capacitors C10 and C11 are adjusted to appropriate capacitances by the setting actuator (not shown). For example, if the power ratio is set to 50% by means of the setting actuator, the shafts of the variable capacitors C10 and C11 are rotated through an angle corresponding to the power ratio. As a result, the ratio between the distributed powers P1 and P2 is set to 1:1. The phase of the distributed power P1 is retarded by $3\pi$ from that of the power of the high frequency power supply 11, while the phase of the distributed power P2 is retarded by $3\pi+90°$ from that of the power of the high frequency power supply 11.

The distributed power P1 is output to the phase shifter 13. In accordance with the rotational angle of the variable capacitors C21 and C22, the phase shifter 13 retards the phase of the voltage b of the power P1 by 0°–180° and applies the phase-retarded voltage to the coil 36 via the matching box 14a. The voltage a of the power P2 output from the variable quadrature detector 12 is applied to the coil 37 via the matching box 14b. Thus, exciting currents flow through the coils 36 and 37. A phase difference between the currents flowing through the coils 36 and 37 is detected by the phase difference detector 17. A voltage corresponding to the phase difference, set by the phase setting section 19, is output to the motor 20 via the amplifier 18. The rotational angle of the shafts of the variable capacitors C21 and C22 is controlled by rotating the motor 20. The rotation of the shafts of the variable capacitors adjusts the phase of the voltage b.

When high frequency currents have flown through the high frequency coils 36 and 37, alternating magnetic fields are generated at the coils 36 and 37. Many of the alternating magnetic fields vertically pass a central space defined in an annual antenna (which is constituted by the coils 36 and 37), thereby forming closed loops. The alternating magnetic fields induce concentric alternating electric fields formed directly below the coils 36 and 37 in the horizontal direction. Electrons circumferentially accelerated by the alternating electric fields collide with neutral particles of a treatment gas, thereby ionizing the gas and creating plasma P. Ions, electrons or the other active materials contained in the plasma are uniformly supplied or radiated onto the overall surface of the semiconductor wafer 64. Thus, a predetermined plasma treatment is performed on the overall surface of the wafer. In a plasma etching process, for example, gas particles activated by plasma chemically react with a to-be-treated material deposited on the wafer 64, thereby etching part of the material. Further, in a cleaning process, the setting actuator is operated to cause the variable quadrature detector 12 to vary the distribution ratio, thereby distributing plasma P in a position close to the wall of the chamber 15. Thus, an optimal plasma distribution for the cleaning process can be obtained.

Changing the phases of the powers P1 and P2 applied to the high frequency coils 36 and 37 results in a change in the distribution of intensity of an electric field induced in the chamber 15. An electric field intensity distribution suitable to each treatment process can be thus obtained. To change the phases of the powers P1 and P2, the phase difference setting section 19 is adjusted. Although it is preferable to adjust the phase difference section 19 such that the phase difference between the powers P1 and P2 is zero, a slight phase difference therebetween will actually raise no problem.

Although, in the above embodiment, the high frequency coils are located on the outside of the chamber, the coils may be located on the inside of the chamber. Also, although the one-turn coil is used as the high frequency coil, a multi-turn coil may be used.

Figure 8:
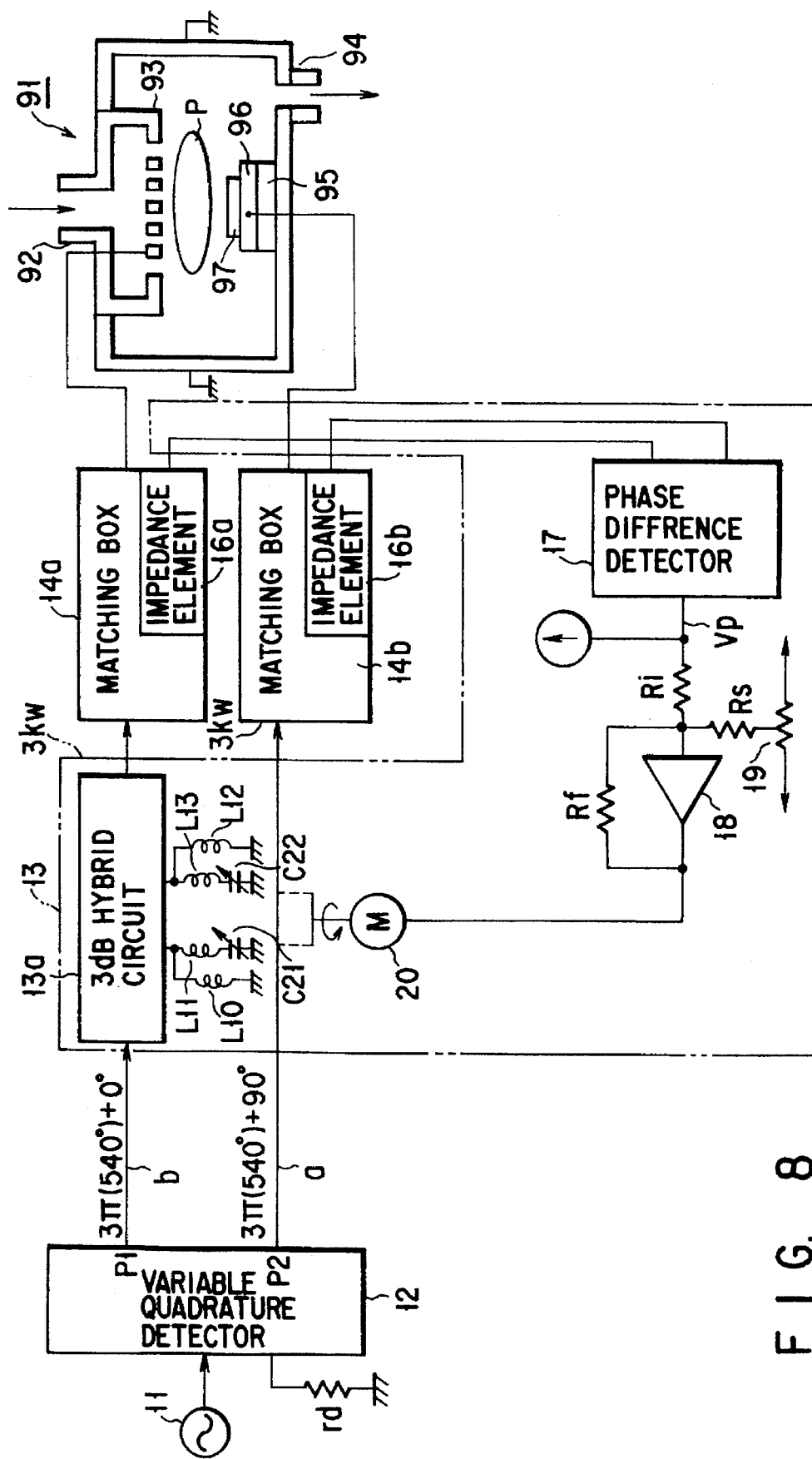
FIG. 8 is a block diagram, showing a plasma apparatus according to another embodiment of the invention.

Another embodiment of the invention will be explained with reference to FIG. 8. In FIG. 8, elements similar to those in FIG. 1 are denoted by corresponding reference numerals, and no detailed explanation will be given thereof.

In FIG. 1, the output terminals of the matching boxes 14a and 14b are connected to the first and second one-turn high frequency coils (FIG. 7) provided in the chamber 15. On the other hand, in this embodiment, the output terminals of the matching boxes 14a and 14b are connected to a parallel plate chamber 91. The parallel plate chamber 91 will be explained.

The chamber 91 is constituted by a cylindrical sealed case. The chamber 91 has a metallic shower head located at its upper surface and provided with a gas supply pipe 92 for supplying into the chamber 91 a predetermined treatment gas at a predetermined pressure and a predetermined flow rate. The chamber 91 further has a vacuum exhaust outlet 94 formed through its lower surface for exhausting a gas in the chamber 91 to set the pressure in the chamber to a predetermined vacuum value. Moreover, a table 95 formed of an insulator is provided on the inner bottom surface of the chamber 91, and an electrostatic chuck electrode 96 is attached to the table 95. A semiconductor wafer 97 is placed on the electrode 96. In other words, the shower head 93 functions as one of parallel plate electrodes, while the electrostatic chuck electrode 96 functions as the other electrode. Furthermore, the output terminal of the matching box 14a is connected to the shower head 93, and that of the matching box 14b is connected to the electrostatic chuck electrode 96. Thus, the shower head 93 and the electrostatic chuck electrode constitute the parallel plate electrodes. The peripheral surface of the chamber 91 is grounded.

The operation of the above-described embodiment will be explained. The semiconductor wafer 97 to be treated is placed on the electrostatic chuck electrode 96, and the pressure in the chamber 91 is set to a predetermined vacuum value by exhaustion of gas through the vacuum exhaust outlet 94. As a result, a predetermined treatment gas can be supplied into the chamber 91 at a predetermined pressure and a predetermined flow rate. In this state, a high frequency power of 13.56 MHz and 3 kW is supplied from the high frequency power supply 11 to the variable quadrature detector 12. The variable capacitors C10 and C11 are adjusted to optimal capacitances. If the power ratio is set to 50% by means of the setting actuator (not shown), the shafts of the variable capacitors C10 and C11 are rotated through an appropriate angle, thereby setting the ratio between the distributed powers P1 and P2 to 1:1. At this time, the phase of the distributed power P1 is retarded by $3\pi$ from that of the power of the high frequency power supply 11, while the phase of the distributed power P2 is retarded by $3\pi+90°$ from that of the power of the high frequency power supply 11.

The distributed power P1 is output to the phase shifter 13. In accordance with the rotational angle of the variable capacitors C21 and C22, the phase shifter 13 retards the phase of the voltage b of the power P1 by 0°–180° and applies the phase-retarded voltage to the shower head 93 via the matching box 14a. The voltage a of the power P2 output from the variable quadrature detector 12 is applied to the electrostatic chuck electrode 96 via the matching box 14b.

A phase difference between currents flowing through the shower head 93 and the electrostatic chuck electrode 96 is detected by the phase difference detector 17. A voltage corresponding to the phase difference, set by the phase setting section 19, is output to the motor 20 via the amplifier 18. The rotational angle of the shafts of the variable capacitors C21 and C22 is controlled by rotating the motor 20. The rotation of the shafts of the variable capacitors adjusts the phase of the voltage b.

When high frequency currents have flown through the shower head 93 and the electrostatic chuck electrode 96, an alternating electric field is generated between the head and the electrode. Electrons circumferentially accelerated by the alternating electric field collide with neutral particles of a treatment gas, thereby ionizing the gas and creating plasma P. Ions, electrons or the other active materials contained in the plasma are uniformly supplied or radiated onto the overall surface of the semiconductor wafer 97. Thus, a predetermined plasma treatment is performed on the overall surface of the wafer.

In a plasma etching process, for example, gas particles activated by plasma chemically react with a to-be-treated material deposited on the wafer 97, thereby etching part of the material. Further, in a cleaning process, the setting actuator is operated to cause the variable quadrature detector 12 to vary the distribution ratio, thereby distributing plasma P in a position close to the wall of the chamber 15. Thus, an optimal plasma distribution for the cleaning process can be obtained.

Although, in the above embodiment, the parallel plate electrodes are located on the inside of the chamber, the electrodes may be located on the outside of the chamber.

As described above, the present invention can provide a plasma apparatus capable of providing an optimal distribution of plasma for each process.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plasma generating apparatus comprising:
   a chamber for containing an object to be treated, the chamber being filled with a treatment gas and having an inside portion and an outside portion;
   a plurality of high frequency coils having different diameters and located substantially coaxially on at least one of the outside portion and inside portion of the chamber and at a position opposed to the object, to ionize the treatment gas for treating the object;
   a high frequency power supply for generating a high frequency power;
   distribution means for distributing the high frequency power into a plurality of distributed powers at a predetermined distribution ratio;
   phase shifter means for shifting the phases of the distributed powers; and
   power supply mans for supplying the high frequency coils with the distributed powers of phases set by the phase shifter means, respectively;
   wherein the high frequency coils comprise first and second one-turn frequency coils arranged concentric on an upper portion of the chamber.

2. The plasma generating apparatus according to claim 1, wherein the distribution means comprises means for distributing the high frequency power into first and second distributed powers with a phase difference of 90°.

3. The plasma generating apparatus according to claim 2, wherein the distribution means receives a power from the high frequency power supply, and comprises a first 3 dB hybrid circuit for generating a first distributed power, a second 3 dB hybrid circuit for generating a second distributed power, and division adjusting means for changing the distribution ratio between the first and second distributed powers.

4. The plasma generating apparatus according to claim 3, wherein the division adjusting means comprises a variable capacitor connected between the first and second 3 dB hybrid circuits and adjusted in accordance with the phase difference, and an inductance connected in series to the variable capacitor.

5. The plasma generating apparatus according to claim 1, wherein the phase shifter means comprises a 3 dB hybrid circuit for shifting the phase of one of the first and second distributed powers from that of the other distributed power, and phase adjusting means connected to the 3 dB hybrid circuit for adjusting the phase of the one of the first and second distributed powers.

6. The plasma generating apparatus according to claim 5, wherein the phase shifter means includes phase difference detecting means for detecting a phase difference between the distributed powers applied to the high frequency coils, phase difference-setting means for setting the detected phase difference to a predetermined phase difference, and control means for controlling the phase adjusted by the phase adjusting means, in accordance with the set phase difference.

7. The plasma generating apparatus according to claim 6, wherein the phase adjusting means comprises a variable capacitor and an inductance, and the control means comprises means for adjusting the rotational angle of the variable capacitor.

8. The plasma generating apparatus according to claim 1, wherein the power supply means comprises a matching box for matching the impedances of the high frequency coils.

9. The plasma generating apparatus according to claim 8, wherein the power supply means has phase detecting means for detecting the phases of the powers applied to the high frequency coils.

10. The plasma generating apparatus according to claim 1, wherein said phase shifter means includes means for setting a shifting amount of the phases of the distributed powers in accordance with a treatment process to be executed.

* * * * *